United States Patent
Goh et al.

(10) Patent No.: US 7,633,313 B2
(45) Date of Patent: *Dec. 15, 2009

(54) DIFFERENTIAL LINE COMPENSATION APPARATUS, METHOD AND SYSTEM

(75) Inventors: Ban Hok Goh, Singapore (SG); Dieter Draxelmayr, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/111,216

(22) Filed: Apr. 29, 2008

(65) Prior Publication Data

US 2008/0218231 A1    Sep. 11, 2008

Related U.S. Application Data

(63) Continuation of application No. 11/543,009, filed on Oct. 4, 2006, now Pat. No. 7,405,598.

(51) Int. Cl.
    *H03K 19/094* (2006.01)
    *H03K 19/0175* (2006.01)
(52) U.S. Cl. ............... 326/86; 326/26; 326/90
(58) Field of Classification Search ............... None
    See application file for complete search history.

(56) References Cited

U.S. PATENT DOCUMENTS

| 6,882,204 | B2 * | 4/2005 | Shizuki | 327/264 |
| 7,405,598 | B2 * | 7/2008 | Goh et al. | 326/86 |
| 7,493,509 | B2 * | 2/2009 | Fung et al. | 713/401 |

* cited by examiner

*Primary Examiner*—Anh Q Tran
(74) *Attorney, Agent, or Firm*—SprylP, LLC

(57) ABSTRACT

A differential line compensation apparatus, semiconductor chip and system are disclosed.

25 Claims, 6 Drawing Sheets

DIFFERENTIAL LINE COMPENSATION APPARATUS, METHOD AND SYSTEM

This application is a Continuation of application Ser. No. 11/543,009, which has a filing date of Oct. 4, 2006, the entire contents thereof being hereby incorporated by reference and of which priority is claimed.

BACKGROUND

Differential signals are becoming popular and important in chip design due to requirements for higher clock and data rates. However, they involve a pair of traces or wires between the driver and the receiver. Typically, one trace carries the positive signal and the other trace carries the negative signal. The negative signal is equal to and opposite the positive signal. As the signals are equal and opposite there is no return signal through ground. The signal that travels down one trace will travel back on the other trace—provided both traces are equal in length and identical.

Unfortunately, in system design, tolerances in printed circuit boards, physical constraints, environmental changes, and so forth, the positive and negative traces are not equal in length, and may not be identical.

FIG. 1 shows the ideal case—when the two traces are of equal length and are identical. Here, there is no time delay. FIG. 2 shows what happens in cases other than the ideal cases. In this case the positive trace is shorter than the negative trace so the signal on the positive trace will arrive earlier than the signal on the negative trace. This gives a time delay that is positive. FIG. 3 shows the reverse—the negative trace is shorter than the positive trace so the negative trace signal arrives earlier than the positive signal trace. This gives a time delay that is negative.

The phase shift difference is a noise source that couples to the ground plane and propagates through the circuitry. Signal integrity is reduced that may cause data error if the phase shift is significant. Furthermore, the phase shift generates a current with a sharp rise time. This may cause EMI problems.

BRIEF DESCRIPTION OF THE DRAWINGS

The detailed description is described with reference to the accompanying figures. The use of the same reference numbers in different instances in the description and the figures may indicate similar or identical items.

DETAILED DESCRIPTION

Figure 4:
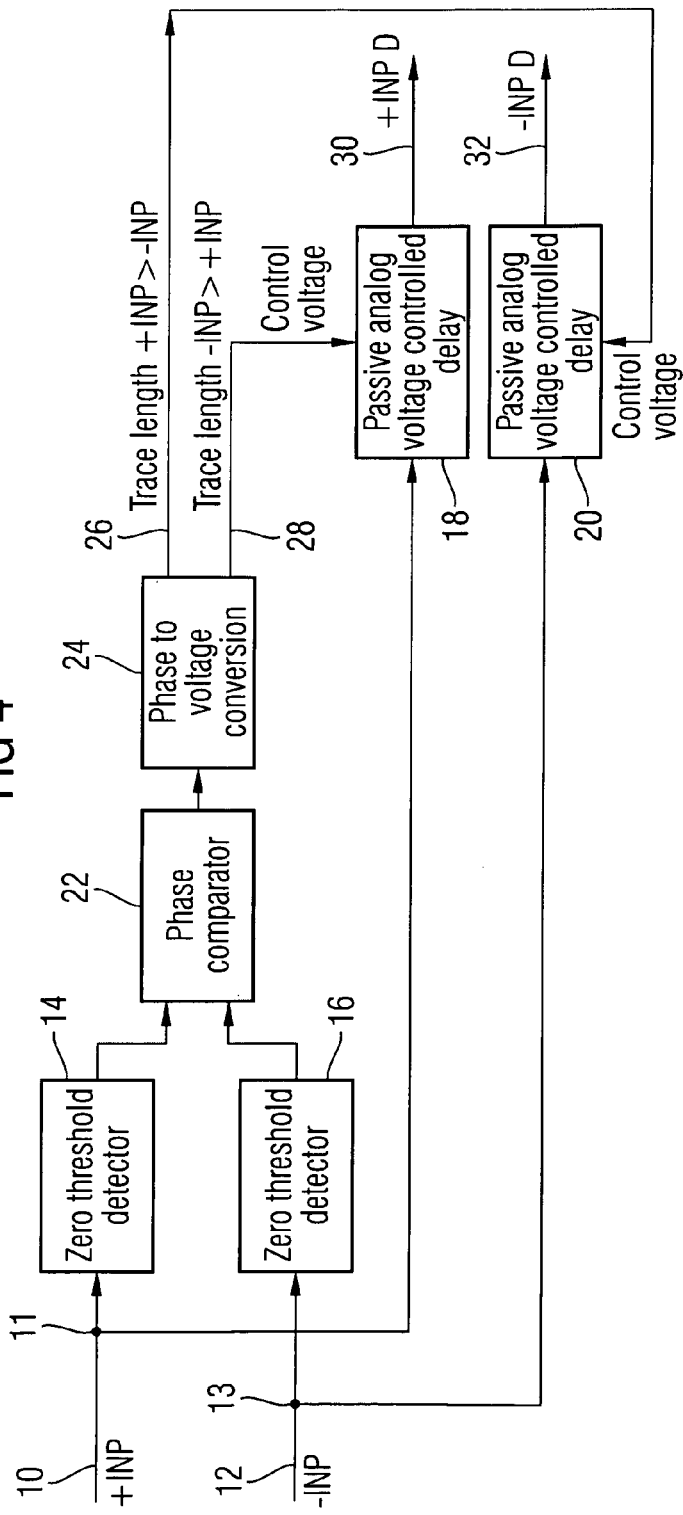
FIG. 4 is an illustration of an embodiment.

In FIG. 4 there is shown a first, preferred embodiment of an apparatus for phase compensation for differential lines that is located at a receive end of a positive trace 10 for positive differential signals input to the apparatus at 11, and at a receive end of a negative trace 12 for negative differential signals input to the apparatus at 13.

Figure 7:
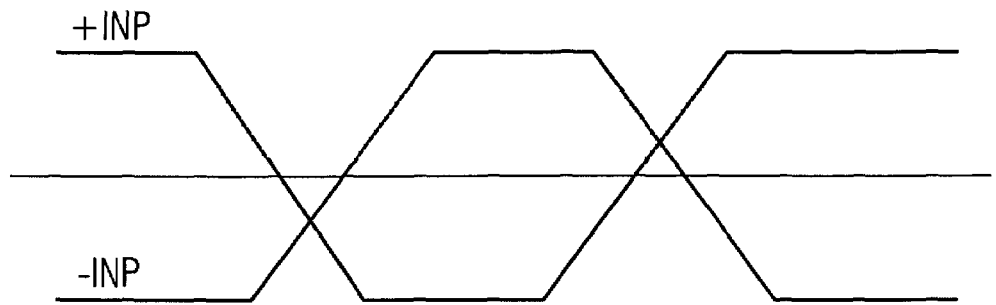
FIG. 7 is an illustration of the signals on the positive and negative traces over a plurality of transitions.

The first preferred embodiment of FIG. 4 is for determining a first condition of the first differential signal and a second condition of the second differential signal. In this case the first and second conditions are both zero thresholds (FIG. 7). As such, each signal input at 11, 13 is applied to a respective zero threshold detector 14, 16 as well as to a respective passive, analog, voltage-controlled delay circuits 18, 20.

Figure 1:
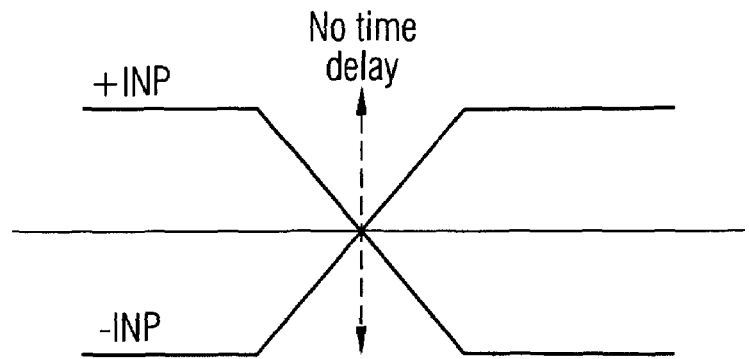
FIG. 1 is an illustration of an ideal case when the two traces are of equal length and are identical.
Figure 2:
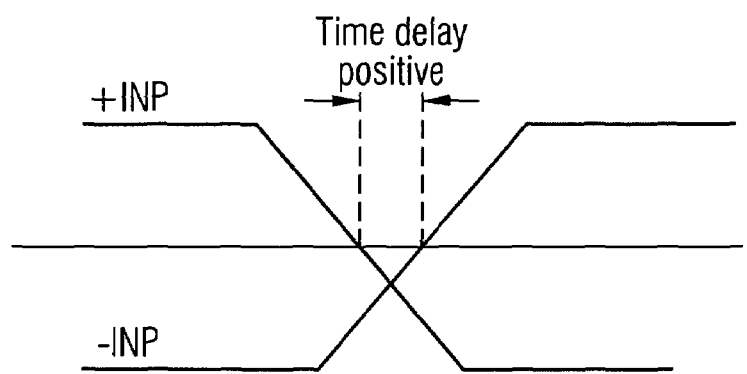
FIG. 2 is an illustration of the case when the positive trace is shorter than the negative trace.
Figure 3:
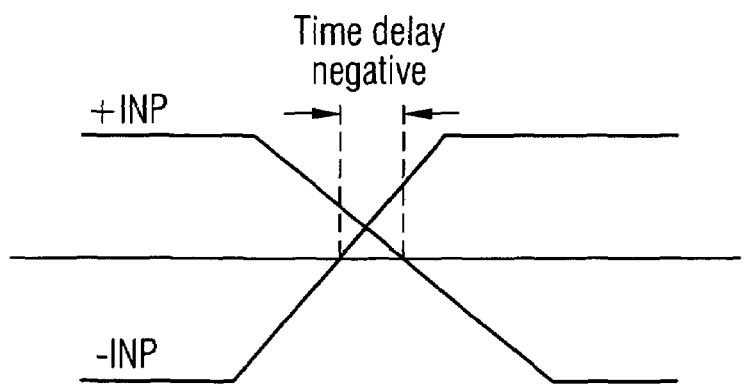
FIG. 3 is an illustration of the case when the negative trace is shorter than the positive trace.
Figure 8:
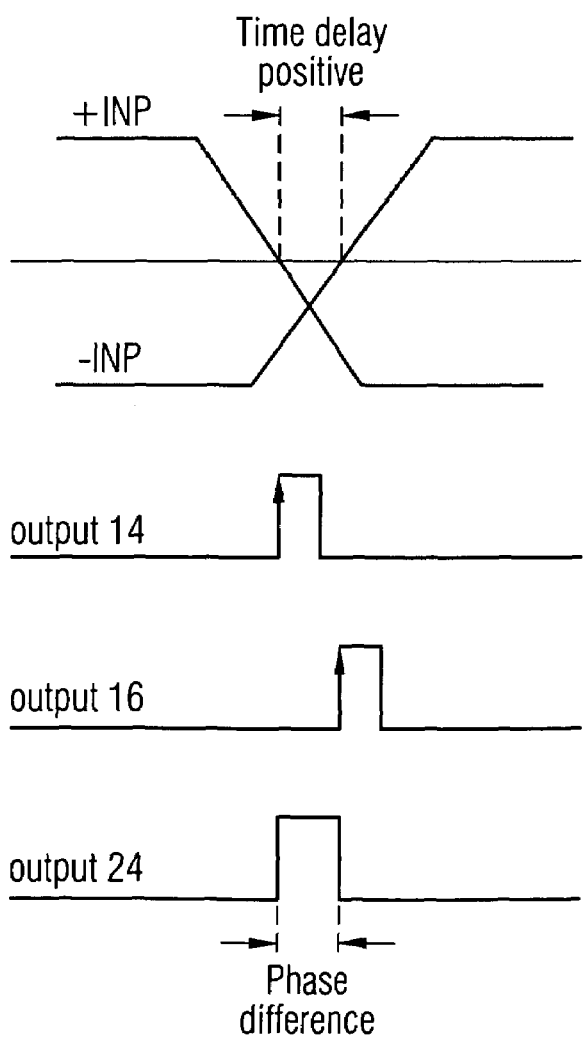
FIG. 8 is an illustration of phase differences for the case of FIG. 2.
Figure 9:
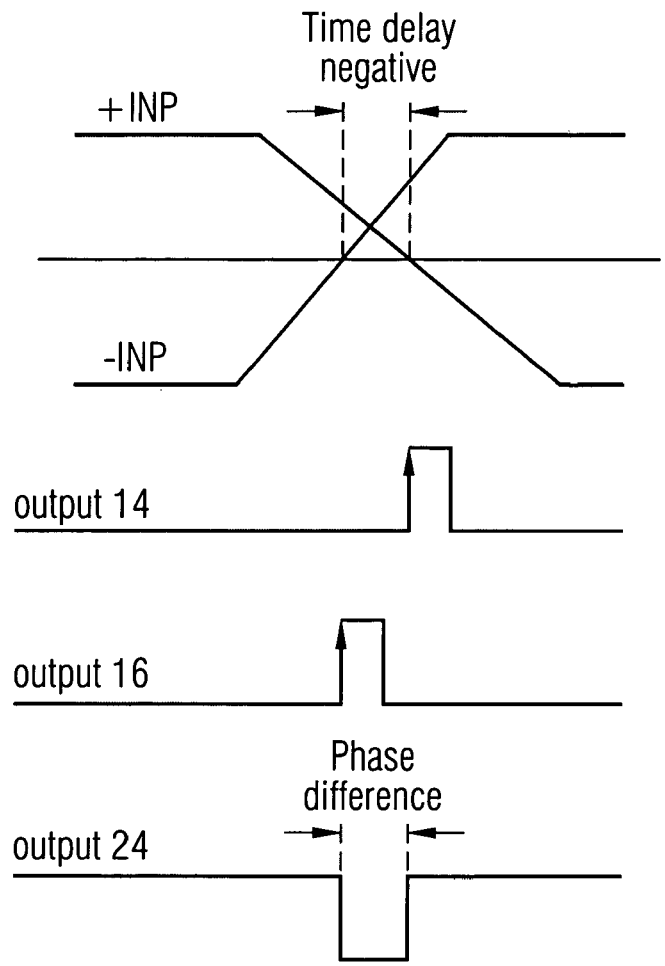
FIG. 9 is an illustration of phase differences for the case of FIG. 3.

The differential signals are input from the terminals 11, 13 directly to the detectors 14, 16 such that the signals processed by the detectors are the differential signals. The detectors 14, 16 detect the location of the zero points for each of the input signals (see FIGS. 2 and 3). As shown in FIGS. 8 and 9, the triggered edges for detectors 14, 16 should be complimentary so detector 14 detects positive edges and detector 16 detects negative edges. FIG. 8 is the situation where the positive trace 10 is longer than negative trace 12, and FIG. 9 is where the negative trace 12 is longer than the positive trace 10.

The outputs of the detectors 14, 16 are input to a phase comparator 22 for comparing the outputs and for providing a measure of the phase difference. If the trace lengths are within specification, the outputs from the detectors 14, 16 should be substantially identical.

The output of the phase comparator 22 is input to a phase-to-voltage converter 24 that converts the measure of the phase difference to a control voltage. The control voltage will vary according to the magnitude of the phase difference; and whether the trace length of the positive trace 10 is greater than the trace length of the negative trace 12, or the trace length of the negative trace 12 is greater than the trace length of the positive trace 10. Hence, converter 24 has two control voltage outputs: a first control voltage 26 for the positive trace 10 being greater than the negative trace 12, and a second control voltage 28 for the negative trace 12 being greater than the positive trace 10. If the trace lengths are within specification, the control voltages 26, 28 will be at predetermined, equal values so that the delay applied is the same for both the positive and negative signals.

The second control voltage 28 is applied to the delay circuit 18 so that the positive input signal is delayed to provide a delayed output 30 that is substantially the same phase as the negative signal on negative trace 12. The first control voltage 26 is applied to the negative delay circuit 20 to provide a delayed negative signal 32 that is substantially the same phase as the positive signal on the positive trace 10.

Figure 5:
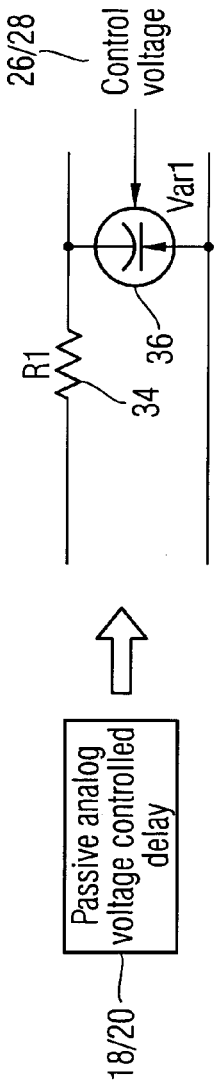
FIG. 5 is an illustration of a preferred form of a voltage controller.

FIG. 5 is an illustration of an example of a circuit for applying the control voltage at the delay circuits 18, 20. It has a resistor 34 and a voltage-controlled varactor diode 36 with the capacitance of the varactor diode 36 changing with the applied control voltage to thus change the delay. It may also be a simple low pass filter. Alternatively or additionally, the circuit may be of a known form of circuit to form controlled delays. For example, it may be a current starved inverter, buffer, or tapped delay line, all of which may be used as controlled delay circuits 18, 20. A tapped delay line has the advantage of building a bridge to a system that is more of a digital system. If the phase comparator 22 outputs a digital number, or an analog phase comparator is used with an analog-to-digital converter, the output may be used for digital control of the delay.

Figure 6:
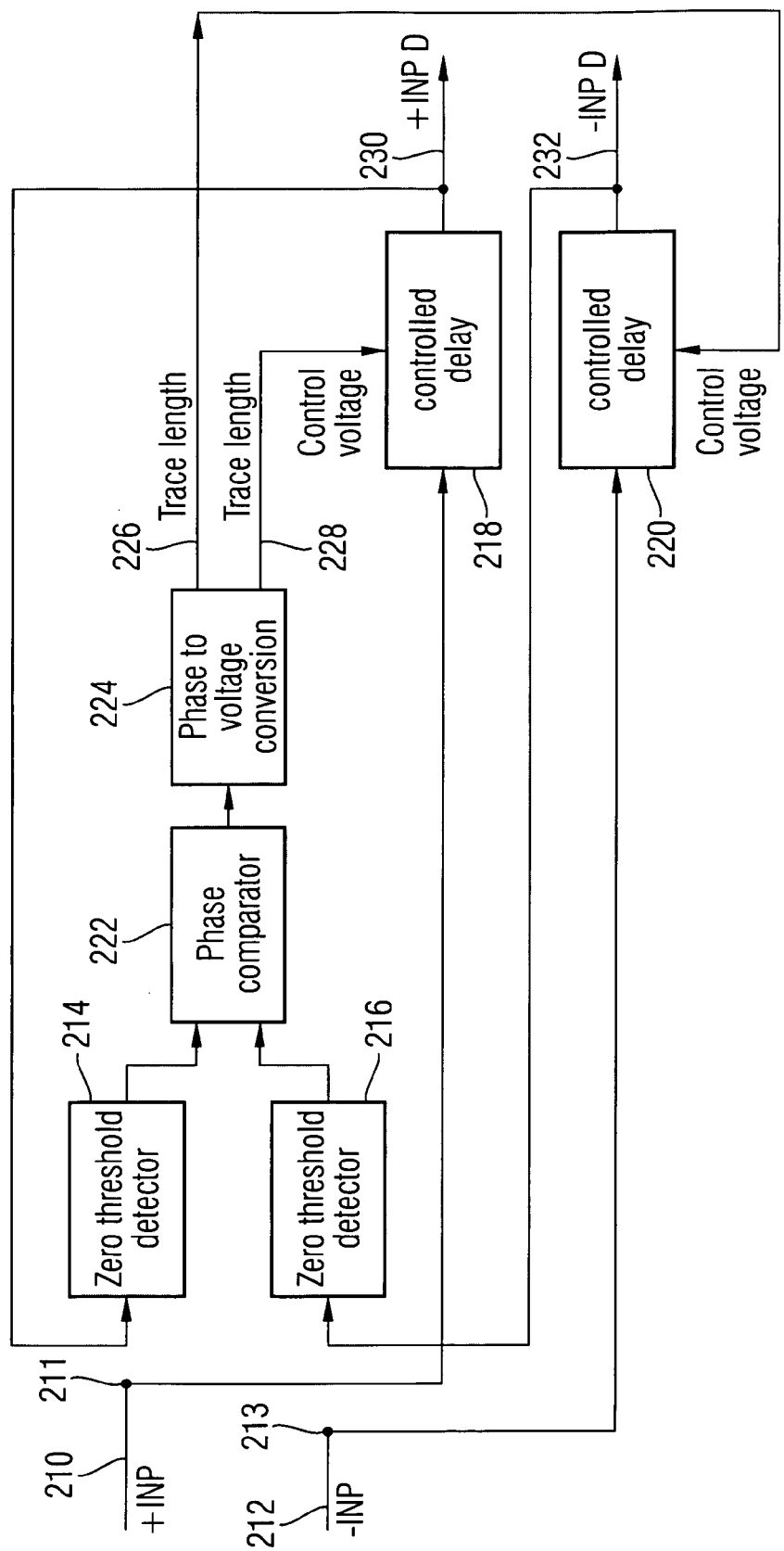
FIG. 6 is an illustration of an alternative embodiment.

FIG. 6 shows a second preferred embodiment. It is similar to the first preferred embodiment of FIG. 4 as both allow digital as well as analog control systems. However, that of FIG. 6 is a closed-loop system rather than the open-loop system of FIG. 4. This allows the formation of a digital control loop without phase-to-number conversion. As such phase errors can be integrated or filtered in digital form. The simplest form of this is an up/down counter. Like reference numerals are used for like components with the addition of a prefix number "2."

Here both transitions (see FIG. 7) are able to be taken into consideration. By averaging the two transitions, it is possible to converge them to give the correct result. As such the circuit of FIG. 6 provides a positive trace 210 for positive differential signals input at 211 and a negative trace 212 for negative differential signals input at 213. Each input differential signal 211, 213 is applied to a respective voltage-controlled delay circuit 218, 220. The outputs of the delay circuits 218, 220 are signals that are related to the input differential signals by the delay applied to them. The output signals are input to the two zero threshold detectors 214, 216.

The detectors 214, 216 detect the location of the zero points for each of the input signals (see FIG. 7). The outputs of the detectors 214, 216 are input to a phase comparator 222 for comparing the outputs and for providing a measure of the phase difference. If the trace lengths are within specification, the outputs from the detectors 214, 216 should be substantially identical.

The output of the phase comparator 222 is input to a phase-to-voltage converter 224 that converts the measure of the phase difference to a control voltage. The control voltage will vary according to the magnitude of the phase difference; and whether the trace length of the positive trace 210 is greater than the trace length of the negative trace 212, or the trace length of the negative trace 212 is greater than the trace length of the positive trace 210. Hence, converter 224 has two control voltage outputs: a first control voltage 226 for the positive trace 210 being greater than the negative trace 212, and a second control voltage 228 for the negative trace 212 being greater than the positive trace 210. If the trace lengths are within specification, the control voltages 226, 228 will be at predetermined, equal values so that the delay applied is the same for both the positive and negative signals.

The second control voltage 228 is applied to the delay circuit 218 so that the positive input signal is delayed to provide a delayed output 230 that is substantially the same phase as the negative signal on negative trace 212. The first control voltage 226 is applied to the negative delay circuit 220 to provide a delayed negative signal 232 that is substantially the same phase as the positive signal on the positive trace 210.

One of the two delays may be a fixed delay, so that only one delay needs to be controlled. If the nominal value of the controlled delay is the same as the nominal value of the fixed delay, and if the controlled delay is able to be adjusted in either direction by, for example, increasing or decreasing the capacitor voltage, this may be sufficient for equalizing the delays.

In FIG. 7, misalignment of the crossing points of the signals may occur at different voltages, depending if a positive or negative edge is considered. Therefore, zero threshold detectors may not be needed. Instead, the predetermined condition may be the voltage level at the crossing points so that the relative voltage levels of the crossing points can be obtained. This may be of benefit where the value of the zero thresholds is not clear or where the rising and falling edges are not symmetrical. The circuit items 14, 16, 22 and 24, as well as 214, 216, 222 and 224, can be replaced by a circuit as shown in FIG. 10 so that the voltage level at which the crossings take place can be obtained.

It is also possible to compare the height of a crossing with mid-scale. This is similar to the zero threshold detection described above but with the difference that both signals are considered at the same time; and the consideration is not at which time this happens but at which voltage level. Mid-scale could be generated by, for example, generating the mean value (e.g., by a resistive interpolator) and sending the mean value into a low-pass filter. This is also a comparison of two different conditions with the first condition being from the detector and the second condition being from a detector detecting mid-scale. Alternatively, if the signal levels are known and, therefore, mid-scale is also known, the second condition does not need to be detected but is fixed.

Figure 10:
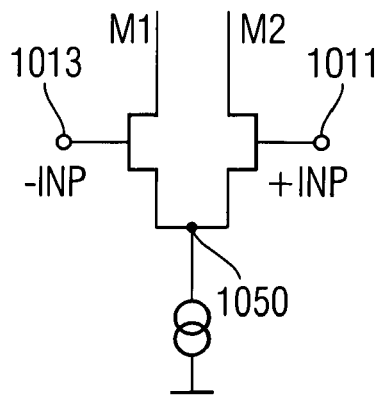
FIG. 10 is an illustration of a first form of a circuit for determining at which voltage level the crossing takes place.
Figure 12:
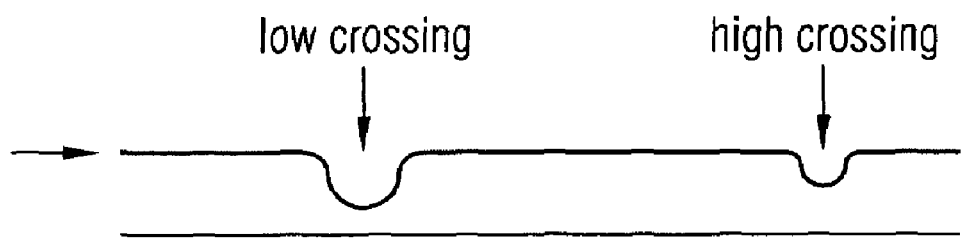
FIG. 12 is a plot of the output of the circuit of FIG. 10.

In FIG. 10 there are two transistors M1 and M2 having a common node 1050. The inputs to the terminals 11, 13 and 211, 213 are instead applied to terminals 1011, 1013 in the same manner as for the embodiment of FIGS. 4 and 6. Therefore, the input differential signals may be applied directly to the terminals 1011, 1013 such that the two transistors M1 and M2 process signals that are the two differential signals, or process signals that are related to the input differential signals by the delay applied to them. If the voltages as shown in FIG. 7 are applied to the gates of the two transistors M1 and M2, the result is shown in FIG. 12. There are two "bumps" of different heights indicating the voltage levels at which the crossings occur when there is misalignment. By use of a comparator 22, the larger voltage can be determined and thus the misalignment of the signals determined. By the appropriate delay, correction is provided.

Figure 11:
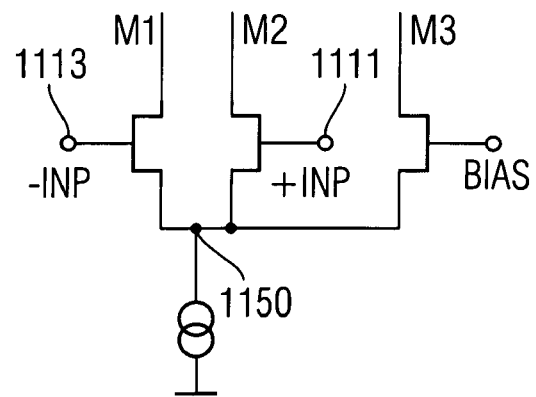
FIG. 11 is an alternative circuit to that of FIG. 10.

The circuit of FIG. 11 is quite similar to that of FIG. 10, except that a third transistor M3 is provided. The third transistor M3 outputs charge packets at its drain, with the charge packets being related to the applied voltages. A big "bump" (low crossing) gives a large charge packet, and a small "bump" (high crossing) gives a small charge packet. The two packets can then be used to charge two identical capacitors that consequently charge to different voltages. Again, the use of a comparator allows the voltage difference to be determined and thus the misalignment of the signals determined. By the appropriate delay, correction is provided.

Figure 13:
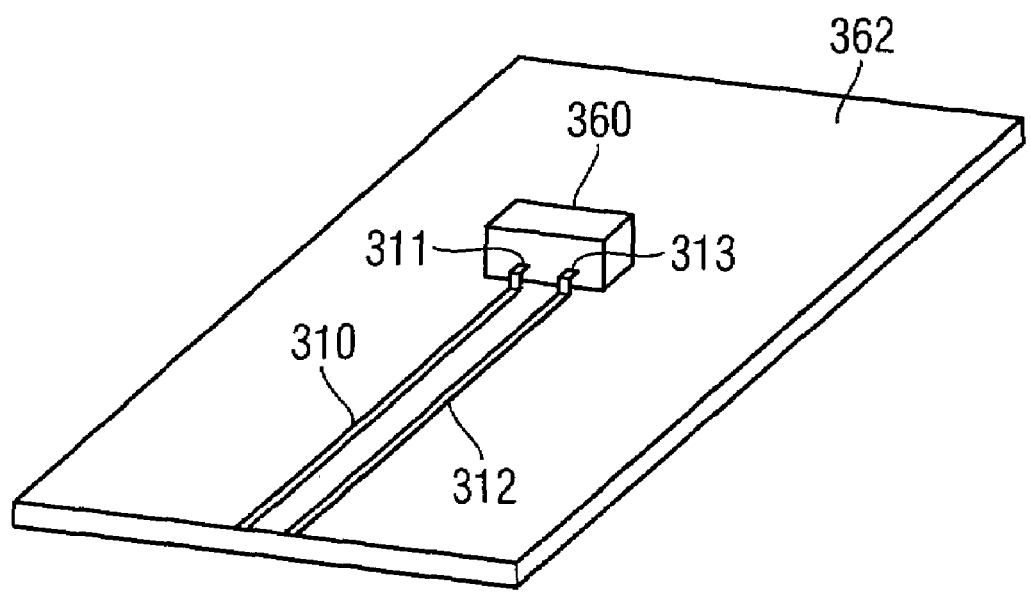
FIG. 13 is an illustration of a further embodiment.

In accordance with one embodiment, FIG. 13 shows a semiconductor chip 360 mounted on a printed circuit board 362 having positive differential trace 310 and negative differential trace 312 connected to the semiconductor chip 360 by terminals 311 and 313 respectively. The semiconductor chip is one embodiment of the apparatus as described above, and performs the methods described above. The semiconductor chip 360 may include circuits additional for other functions (not shown nor described) and may perform other, additional methods (not shown nor described). The printed circuit board 362 may have other traces (not shown nor described).

By having the apparatus at the receive end of the traces 10, 12/210, 212 the result obtained is relatively accurate as any changes in the performance or physical characteristics of the traces are included in the compensation. Also, by having the compensation continuous (as long as there are input signals)

any changes in the performance or physical characteristics of the traces over time will also be included in the compensation.

CONCLUSION

For the purposes of this disclosure and the claims that follow, the terms "coupled" and "connected" may have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

The invention claimed is:

1. A differential line compensation apparatus comprising:
a first terminal to receive a first differential signal supplied by a first trace and a second differential signal supplied by a second trace;
at least one detector to detect a first condition of a first signal related to the first differential signal, and a second condition of a second signal related to the second differential signal, and to provide at least one output containing results of the detections;
a comparator coupled to the at least one detector to receive and process the at least one output and to provide a control output, the processing of the at least one output including converting the at least one output to a different signal; and
at least one delay controller to receive the control output and apply a phase correction to a selected one of the first signal and the second signal.

2. The apparatus as claimed in claim 1, wherein the comparator comprises a phase comparator and a phase-to-voltage converter, the phase-to-voltage converter to convert at least one output from the phase comparator to the control output.

3. The apparatus as claimed in claim 1, wherein the apparatus is coupled to a receive end of the first trace and the second trace.

4. The apparatus as claimed in claim 1, wherein the first condition is a first voltage level of a first crossing of the first signal, and the second signal, and the second condition is a second voltage level of a second crossing of the first signal and the second signal.

5. The apparatus as claimed in claim 4, wherein the first voltage level and the second voltage level are used to determine a relative voltage level.

6. The apparatus as claimed in claim 4, wherein the at least one detector comprises a first transistor and a second transistor, the first and second transistors having a common node, the first signal applied to a gate of the first transistor, and the second signal being able to be applied to a gate of the second transistor.

7. The apparatus as claimed in claim 6 further comprising a third transistor also having the common node to deliver charge packets at its drain, the charge packets being related to the first voltage level and the second voltage level.

8. The apparatus as claimed in claim 6, wherein the first signal is the first differential signal, and the second signal is the second differential signal.

9. The apparatus as claimed in claim 6, wherein a first delay is applied to the first differential signal to form the first signal, and a second delay is applied to the second differential signal to form the second signal.

10. The apparatus as claimed in claim 1, wherein the first signal is the first differential signal and the first condition is a zero threshold of the first signal, and wherein the second signal is the second differential signal, the second condition being a zero threshold of the second signal.

11. The apparatus as claimed in claim 10, wherein there are two detectors comprising a first detector operatively coupled to the first terminal and being a first zero threshold detector, and a second detector operatively coupled to the second terminal and being a second zero threshold detector.

12. The apparatus as claimed in claim 11, wherein the comparator comprises a phase comparator and a phase-to-voltage converter to convert the at least one output from the phase comparator to the control output.

13. The apparatus as claimed in claim 12, wherein there are two delay controllers comprising a first delay controller operatively connected to the first terminal and the phase-to-voltage converter to apply a first delay to the first signal, and a second delay controller operatively connected to the second terminal and the phase-to-voltage converter to apply a second delay to the second signal.

14. The apparatus as claimed in claim 13, wherein the first delay corresponds to the second trace being longer than the first trace, and the second delay corresponds to the first trace being longer than the second trace.

15. The apparatus as claimed in claim 13, wherein one of the first delay and the second delay is fixed and the other of the first delay and the second delay is able to be controlled and adjusted in either direction.

16. The apparatus as claimed in claim 1, wherein there are two detectors comprising a first detector and a second detector, and two delay controllers comprising a first delay controller operatively connected to the first terminal to receive the first differential signal and apply a first delay to the first differential signal to form the first signal, and a second delay controller operatively connected to the second terminal to receive the second differential signal and apply a second delay to the second differential signal to form the second signal, the first delay controller being operatively connected to the first detector to supply the first signal to the first detector, and the second trace is operatively connected to the second detector to supply the second signal to the second signal to the second detector.

17. A semiconductor chip, comprising:
a first terminal to receive a first differential signal from a first trace of a differential line;
a second terminal to receive a second differential signal from a second trace of the differential line; and
a delay controller coupled to the first and second terminals to shift a phase of at least one of the first and second differential signals based on a delay of received first and second differential signals to compensate for differences in length of the first and second traces, the delay being determined based on a phase difference of the first and second differential signals, the delay controller to shift the phase by converting the phase difference to a different signal and using the different signal to shift the phase.

18. The semiconductor chip according to claim 17, further comprising a phase detector, the phase detector comprising input terminals coupled to the first and second terminals and an output terminal coupled to the delay controller to provide a signal indicating a delay of the first and second differential signals.

19. The semiconductor chip according to claim 18, wherein the phase detector comprises a detector arrangement to detect a voltage level of a crossing of signals received at the input terminals of the phase detector.

20. The semiconductor chip according to claim 18, wherein the phase detector comprises a detector arrangement to detect a time interval between crossings of signals received at the input terminals of the phase detector and a predetermined voltage level.

21. The semiconductor chip according to claim 20, wherein the predetermined voltage is a common-mode voltage of the first and second differential signals.

22. The semiconductor chip according to claim 17, further comprising a phase detector, the phase detector comprising input terminals coupled to output terminals of the delay controller and an output terminal coupled to the delay controller to feed back a signal indicating a delay of the output signals of the delay controller.

23. A differential line compensation system comprising:
a printed circuit board comprising a pair of differential line traces;
a semiconductor chip mounted to the printed circuit board, the semiconductor chip comprising: a first terminal to receive a first differential signal from a first trace of a differential line; a second terminal to receive a second differential signal from a second trace of the differential line; and
a delay controller coupled to the first and second terminals to receive the first and second differential signals and to shift the phase of at least one of the first and second differential signals based on a delay of the received first and second differential signals to compensate differences in length of the first and second traces, the delay being determined based on a phase difference of the first and second differential signals, the delay controller to shift the phase by converting the phase difference to a different signal and using the different signal to shift the phase.

24. The system according to claim 23 further comprising a phase detector, the phase detector comprising input terminals coupled to the first and second terminals and an output terminal coupled to the delay controller to provide a signal indicating a delay of the first and second differential signals.

25. The system according to claim 23, further comprising a phase detector, the phase detector comprising input terminals coupled to output terminals of the delay controller and an output terminal coupled to the delay controller to feed back a signal indicating a delay of the output signals of the delay controller.

* * * * *